United States Patent
Kunimoto

(10) Patent No.: US 8,410,614 B2
(45) Date of Patent: Apr. 2, 2013

(54) SEMICONDUCTOR DEVICE HAVING A SEMICONDUCTOR ELEMENT BURIED IN AN INSULATING LAYER AND METHOD OF MANUFACTURING THE SAME

(75) Inventor: Yuji Kunimoto, Nagano (JP)

(73) Assignee: Shinko Electric Industries Co., Ltd., Nagano-shi (JP)

(*) Notice: Subject to any disclaimer, the term of this patent is extended or adjusted under 35 U.S.C. 154(b) by 50 days.

(21) Appl. No.: 13/034,021

(22) Filed: Feb. 24, 2011

(65) Prior Publication Data
US 2011/0221069 A1 Sep. 15, 2011

(30) Foreign Application Priority Data
Mar. 10, 2010 (JP) ................................. 2010-052961

(51) Int. Cl.
*H01L 23/48* (2006.01)
*H01L 21/52* (2006.01)

(52) U.S. Cl. ............... 257/774; 257/E23.011; 257/773; 257/686; 257/685; 257/738; 257/737; 257/777; 257/778

(58) Field of Classification Search ............... 257/774, 257/773, E23.011, E21.5, 686.685, 738, 737, 257/77.77, 777, 778
See application file for complete search history.

(56) References Cited

U.S. PATENT DOCUMENTS

| | | | | |
|---|---|---|---|---|
| 7,957,154 B2* | 6/2011 | Ito et al. | .................. | 361/765 |
| 2009/0072384 A1* | 3/2009 | Wong et al. | .............. | 257/712 |
| 2011/0039370 A1* | 2/2011 | Gomyo et al. | ........... | 438/109 |
| 2011/0177654 A1* | 7/2011 | Lee et al. | ................ | 438/107 |
| 2011/0193203 A1* | 8/2011 | Goto et al. | ............... | 257/659 |
| 2011/0194265 A1* | 8/2011 | Su et al. | .................. | 361/761 |
| 2011/0227223 A1* | 9/2011 | Wu et al. | ................. | 257/738 |
| 2011/0241193 A1* | 10/2011 | Ding et al. | .............. | 257/686 |
| 2012/0038053 A1* | 2/2012 | Oh et al. | ................. | 257/773 |
| 2012/0049364 A1* | 3/2012 | Sutardja et al. | ......... | 257/738 |
| 2012/0074580 A1* | 3/2012 | Nalla et al. | .............. | 257/774 |
| 2012/0119379 A1* | 5/2012 | Koizumi et al. | .......... | 257/774 |
| 2012/0175779 A1* | 7/2012 | Lin | ......................... | 257/773 |

FOREIGN PATENT DOCUMENTS
JP 2006-222164 A1 8/2006

* cited by examiner

*Primary Examiner* — A O Williams
(74) *Attorney, Agent, or Firm* — Kratz, Quintos & Hanson, LLP

(57) ABSTRACT

A semiconductor device includes a semiconductor element having a first surface on which an electrode terminal is formed, and a second surface located opposite to the first surface. The semiconductor device further includes a first insulating layer in which the semiconductor element is buried, and second insulating layers and wiring layers formed in such a manner that at least one insulating layer and at least one wiring layer are formed on each of both surfaces of the first insulating layer. The electrode terminal of the semiconductor element is connected to a first wiring layer located on the first surface side through a first via formed in the first insulating layer, and the first wiring layer is connected to a second wiring layer located on the second surface side through a second via formed in the first insulating layer.

6 Claims, 7 Drawing Sheets

SEMICONDUCTOR DEVICE HAVING A SEMICONDUCTOR ELEMENT BURIED IN AN INSULATING LAYER AND METHOD OF MANUFACTURING THE SAME

CROSS-REFERENCE TO RELATED APPLICATION

This application is based upon and claims the benefit of priority of the prior Japanese Patent Application No. 2010-052961, filed on Mar. 10, 2010, the entire contents of which are incorporated herein by reference.

FIELD

The embodiment discussed herein is related to a semiconductor device in which a semiconductor element is buried in a wiring board, and to a method of manufacturing the semiconductor device.

The wiring board in the semiconductor device is also referred to as a "semiconductor package" or simply a "package" in the following description, for the sake of convenience.

BACKGROUND

As a technique of fabricating a multilayer wiring board, a build-up method has been widely used. The build-up method typically includes the processes of forming an insulating layer, forming via holes in the insulating layer, and then forming a wiring layer while filling the via holes with a conductor (via). The processes are sequentially repeated on both sides of a core substrate serving as a base so that the layers are stacked on one another. In this structure, the wiring layers and the insulating layers can be formed to be thin because these layers are stacked by the build-up method. On the other hand, the core substrate requires a thickness large enough for the wiring board to have a certain rigidity. This hinders the reduction in thickness of the entire package.

For this reason, a structure without a core substrate (support base member) has been recently employed in order to achieve a further reduction in thickness of the wiring board (semiconductor package). The wiring board having such a structure is called a "coreless substrate" because the wiring board has no core. Although a detailed description of the method of fabricating the coreless substrate is omitted herein, the method basically includes the processes of forming pads on a temporary substrate serving as a support member, then forming build-up layers on the pads and the temporary substrate, and finally removing the temporary substrate (support member).

As one form of a semiconductor device using such a coreless substrate, there is a structure in which a semiconductor element is mounted on one surface of the substrate and external connection terminals are bonded to the other surface of the substrate. In the semiconductor device employing this structure, electrode pads of the semiconductor element (chip) are flip-chip connected via conductive bumps to pads (terminal portions) exposed from the one surface of the substrate. Namely, in the semiconductor device of this structure, the semiconductor chip having a coefficient of thermal expansion (CTE) largely different from a CTE of the substrate is mounted on the one surface of the substrate. Accordingly, distribution of the CTE is asymmetric in the up-and-down direction when the structure of the board is vertically viewed.

As another form of a semiconductor device designed to be thin by eventually removing the support member as in the case of the coreless substrate, there is a structure formed by burying a semiconductor element in a substrate, instead of surface-mounting the semiconductor element on the substrate. An example of the technique related to this structure is described in Japanese Laid-open Patent Publication No. 2006-222164 (hereinafter, referred to as Patent Document 1).

In a semiconductor device of the type in which a semiconductor element is surface-mounted on a wiring board, the element and the substrate are connected to each other through conductive bumps. This involves a problem in that it is not possible to make the pitch between the terminals of the element finer (to reduce the pitch) because the pitch depends upon the size of the bump. It is possible to reduce the pitch where the size of the bump is reduced. In this case, however, another problem occurs in that handling, or transfer of the solder balls onto the substrate, cannot be easily performed.

Moreover, the thickness of the entire semiconductor device is increased by the amount of the diameter of the bump. In addition, when the semiconductor element (chip or die) is mounted, a thickness large enough to provide a certain strength (not less than 100 µm in the state of the art) is needed due to the limitation on handling such as pick-up or die attachment. For this reason, a problem arises in that the thickness of the entire semiconductor device is further increased.

The semiconductor device of the type formed by burying the semiconductor element in the substrate, as described in Patent Document 1 above, uses no bump to connect the element and the substrate. Accordingly, the semiconductor device of this type does not have to deal with the aforementioned problem. However, the semiconductor devices of a structure in which the entire package is thinly formed (coreless substrate), inclusive of the semiconductor device described in Patent Document 1, have an up-and-down asymmetric structure. Specifically, the structure includes the insulating layers and the wiring layers stacked only on the electrode terminal side of the semiconductor element. Accordingly, the distribution of the coefficient of thermal expansion (CTE) is asymmetric in the up-and-down direction when the structure is vertically viewed. For this reason, there is a problem in that warp of the substrate easily occurs.

In addition, the semiconductor device of this structure poses a problem when it is applied to a so-called package-on-package (POP) structure or multi-chip package (MCP) structure. Specifically, no wiring or no external terminal is provided on a back surface side (i.e., the opposite side to the side on which electrode terminals are formed) of the element to be mounted on the substrate. For this reason, when a surface mount technology (SMT) component such as another package or a chip capacitor is mounted on the substrate, the layout of the terminals of the SMT component, or the mounting position thereof, is limited. As a result, the degree of freedom in the mounting is limited. In other words, the semiconductor device of this structure cannot be easily applied to a POP structure or the like without causing such an inconvenience.

SUMMARY

According to one aspect of the invention, a semiconductor device includes a semiconductor element having a first surface on which an electrode terminal is formed, and a second surface located opposite to the first surface; a first insulating layer in which the semiconductor element is buried; and second insulating layers and wiring layers formed in such a manner that at least one insulating layer and at least one wiring layer are formed on each of both surfaces of the first insulating layer, wherein the electrode terminal of the semiconductor element is connected to a first wiring layer located on the first surface side through a first via formed in the first insulating layer, and the first wiring layer is connected to a second wiring layer located on the second surface side through a second via formed in the first insulating layer.

According to another aspect of the invention, a method of manufacturing a semiconductor device, includes mounting a semiconductor element having a first surface on which an electrode terminal is formed, and a second surface located opposite to the first surface, on a first support member with the first surface being directed upward; forming a first insulating layer on the first support member so as to seal the semiconductor element; forming a first wiring layer on the first insulating layer so as to be connected to the electrode terminal of the semiconductor element through a first via formed in the first insulating layer; forming a second insulating layer so as to cover the first wiring layer and then removing the first support member; mounting a structure resulting from the removal of the first support member, on a second support member with the second surface of the semiconductor element being directed upward; polishing the second surface of the semiconductor element together with the first insulating layer so as to thin the semiconductor element; forming a third insulating layer on the first insulating layer and the second surface of the thinned semiconductor element; forming a second wiring layer on the third insulating layer so as to be connected to the first wiring layer through a second via which is formed to penetrate through the third insulating layer and the first insulating layer; and forming a fourth insulating layer so as to cover the second wiring layer and then removing the second support member.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Hereinafter, preliminary matters for facilitating the understanding of embodiments are described.

Figure 7:
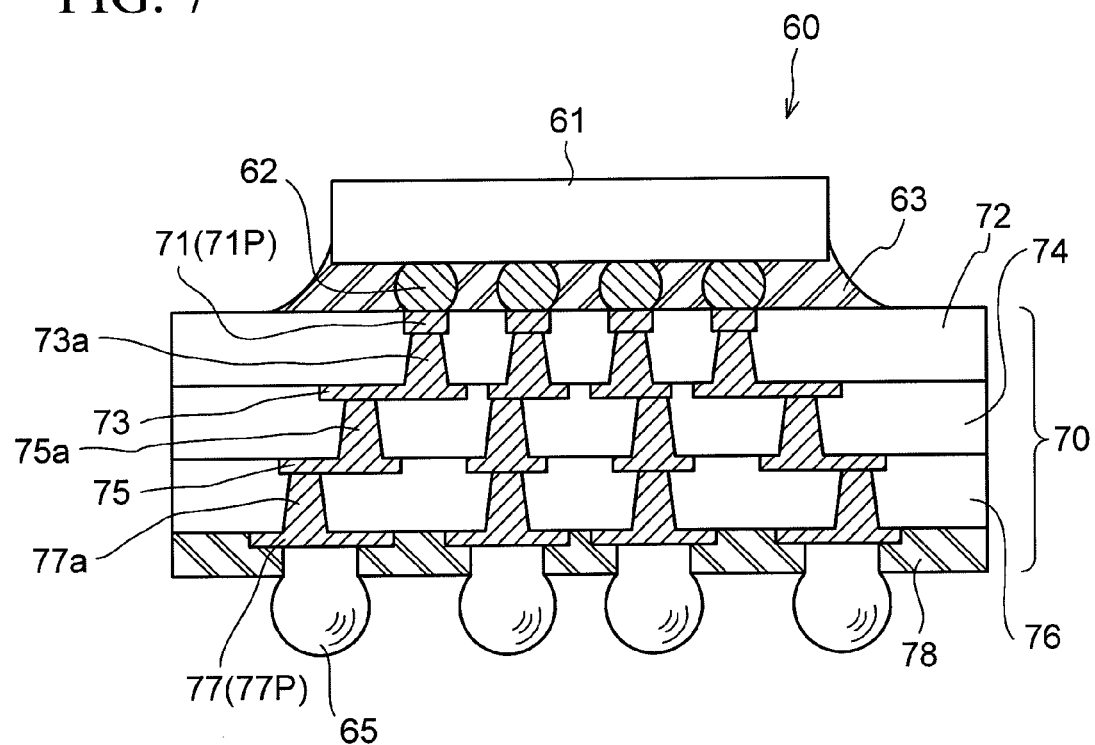
FIG. 7 is a cross-sectional view illustrating, as a related art, a configuration of a semiconductor device using a coreless substrate.

FIG. 7 illustrates, as a related art, a configuration of a semiconductor device using a coreless substrate, in a form of a cross-sectional view.

In a semiconductor device 60 illustrated in FIG. 7, a wiring board (coreless substrate) denoted by reference numeral 70 has a structure in which four wiring layers 71, 73, 75 and 77 and three insulating layers (typically, resin layers) 72, 74 and 76 are stacked one on top of another. The wiring layers 71, 73, 75 and 77 are electrically connected to each other through vias 73a, 75a and 77a formed in the corresponding insulating layers 72, 74 and 76.

Electrode pads (not illustrated) of a semiconductor element (typically, a silicon chip) 61 are flip-chip bonded via solder bumps 62 to pads 71P (portions of the wiring layer 71) exposed from one surface of the board 70. Furthermore, the chip 61 is fixed onto the board 70 by an underfill resin 63 filled into a gap between the mounted chip 61 and the board 70. A protection film (solder resist layer) 78 is formed on the other surface of the board 70 while the portions of pads 77P each defined at a required position of the wiring layer 77 are left exposed. In addition, external connection terminals (solder balls 65) are bonded to the pads 77P exposed from the protection film 78.

Specifically, in the semiconductor device 60, the semiconductor chip 61 having a coefficient of thermal expansion (CTE) largely different from a CTE of the board 70 is mounted on one surface of the board 70. Namely, the distribution of the CTE is asymmetric in the up-and-down direction when the board structure is vertically viewed.

Thus the element and the board are connected to each other through the conductive bumps (solder balls or the like). This involves a problem in that it is not possible to make the pitch between the terminals of the element finer (to reduce the pitch) because the pitch depends upon the size of the bump. Where the size of the bump is reduced, the pitch can be reduced as well. In this case, however, another problem occurs in that handling, or transfer of the solder balls onto the board, cannot be easily performed.

Moreover, the thickness of the entire semiconductor device is increased by the amount of the diameter of the bump. In addition, when the semiconductor element (chip or die) is mounted, a thickness large enough to provide a certain strength (not less than 100 μm in the state of the art) is needed due to the limitation on handling such as pick-up or die attachment. For this reason, there arises a problem in that the thickness of the entire semiconductor device is further increased.

Further, the distribution of the coefficient of thermal expansion (CTE) is asymmetric in the up-and-down direction when the structure is vertically viewed. For this reason, a problem arises in that warp of the substrate easily occurs.

In addition, the semiconductor device 60 of this structure has an inconvenience when it is applied to a so-called package-on-package (POP) structure or multi-chip package (MCP) structure. Specifically, since no wiring or no external terminal is provided on a back surface side (opposite side to the side on which electrode terminals are formed) of the element to be mounted on the substrate, a surface mount technology (SMT) component such as another package or a chip capacitor cannot be freely mounted on the substrate. Accordingly, the degree of freedom in the mounting is limited. Namely, the semiconductor device of this structure cannot be easily applied to a POP structure or the like without causing such an inconvenience.

Next, the embodiments are described.

Figure 1:
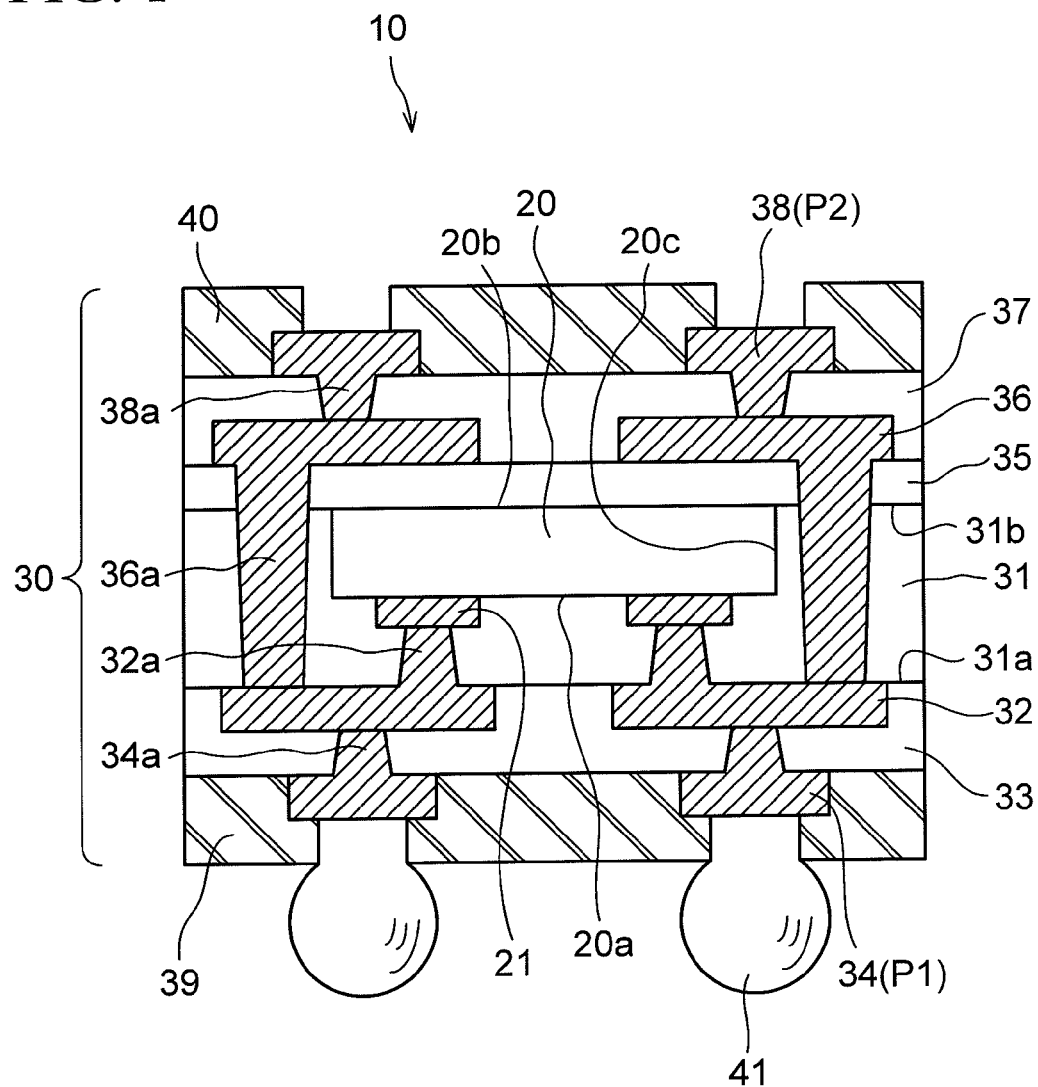
FIG. 1 is a cross-sectional view illustrating a configuration of a semiconductor device according to an embodiment.

FIG. 1 illustrates a configuration of a semiconductor device according to an embodiment, in a form of a cross-sectional view.

A semiconductor device 10 according to the embodiment has a structure in which a required number (one in the illustrated example) of semiconductor elements (chips) 20 are buried in a wiring board (package) 30. The semiconductor element 20 to be buried in the board 30 is a silicon chip (also referred to as a "die") obtained by dicing, in device units, multiple devices fabricated on a silicon wafer by a wafer-level process, for example. In addition, the semiconductor element 20 is an active element such as a CPU.

As illustrated in FIG. 1, the wiring board (package) 30 has a structure in which four wiring layers 32, 34, 36, and 38 and four insulating layers 31, 33, 35, and 37 are stacked one on top of another. Among these insulating layers, the insulating layer 31 sealing and burying the chip 20 therein is formed to be thicker than the other insulating layers 33, 35, and 37. The insulating layer 31 serves as a support base member (core) of the semiconductor device 10. The wiring layer 32, which is the first wiring layer in descending order, is formed in a required pattern shape on one surface 31a (lower surface in the illustrated example) of the insulating layer 31.

The chip 20 is buried in the insulating layer 31 in the following manner. Specifically, the surface on the side where electrode terminals 21 of the chip 20 are formed (circuit formation surface 20a) is directed toward the one surface 31a of the insulating layer 31. In addition, the circuit formation surface 20a and the side surface 20c of the chip 20 are covered by the insulating layer 31. The back surface 20b of the chip 20, which is opposite to the circuit formation surface 20a, becomes flush with the other surface 31b (upper surface in the illustrated example) of the insulating layer 31. The wiring layer 32, which is the first wiring layer, is connected to the electrode terminals 21 of the chip 20 via conductors (vias 32a) filled into via holes formed in the insulating layer 31.

Moreover, the insulating layer 33 is formed so as to cover the wiring layer 32. Then, the wiring layer 34, which is the second wiring layer in descending order, is formed in a required pattern shape on the insulating layer 33. This wiring layer 34 is connected to the first wiring layer 32 via conductors (vias 34a) filled into via holes formed in the insulating layer 33. The second wiring layer 34 constitutes an outermost wiring layer of the board 30 in this embodiment.

The insulating layer 35 is formed on the other surface 31b of the insulating layer 31, which seals the chip 20. The wiring layer 36, which is the first wiring layer in ascending order, is formed in a required pattern shape on the insulating layer 35. The wiring layer 36 is patterned to extend to a portion corresponding to an inner side of the mounting area of the chip 20 (portion corresponding to the back surface 20b of the chip 20) on the insulating layer 35. In addition, the wiring layer 36 is connected to the wiring layer 32, which is the first wiring layer in descending order, through conductors (vias 36a) filled into via holes which are formed to penetrate through the insulating layer 35 and the insulating layer 31 in the regions outside the mounting area of the chip 20.

Moreover, the insulating layer 37 is formed to cover the wiring layer 36. The wiring layer 38, which is the second wiring layer in ascending order, is formed in a required pattern shape on the insulating layer 37. This wiring layer 38 is connected to the first wiring layer 36 via conductors (vias 38a) filled into via holes formed in the insulating layer 37. In the same manner, the second wiring layer 38 constitutes an outermost wiring layer of the board 30.

As a material of the insulating layers 31, 33, and 37, an epoxy-based resin, a polyimide-based resin, a phenol resin or the like, which are widely used as a build-up resin, is preferably used. As a material of the wiring layers 32, 34, 36 and 38, copper (Cu) is typically used.

Moreover, an appropriate surface treatment is applied to the portions of pads P1 and P2 defined at required positions of the outermost wiring layers 34 and 38, to thereby improve contact properties of these portions. This is because external connection terminals (such as solder balls) or the like are bonded to the portions of the pads P1 or P2, the external connection terminals being used when this package (wiring board 30) is mounted on a motherboard or the like or when a POP structure is formed with another package, or electrode terminals of another electronic component (active element such as a semiconductor element or a passive element such as a capacitor). For example, nickel (Ni) plating and gold (Au) plating are applied in this order, or Ni plating, palladium (Pd) plating and Au plating are applied in this order. Specifically, the portions of the pads P1 and P2 are each formed of a layered structure of Cu/Ni/Au or Cu/Ni/Pd/Au.

Further, solder resist layers 39 and 40 each serving as a protection film are formed respectively on the both surfaces of the wiring board 30 in such a manner as to cover a corresponding one of the surfaces while leaving a corresponding one of the pads P1 or P2 exposed from the surface. Solder balls 41 each serving as an external connection terminal are bonded respectively to the pads P1 exposed from the solder resist layer 39 on the one surface of the wiring board (on the surface side where the electrode terminals of the chip 20 are positioned in the illustrated example) among the surfaces of the wiring board 30. The solder balls 41 may be bonded respectively to the pads P2 exposed from the solder resist layer 40 positioned on the opposite side to the illustrated example (i.e., on the side closer to the back surface 20b of the chip 20).

Although, in this embodiment, a ball grid array (BGA) structure in which the solder balls 41 are bonded to the pads P1 (or the pads P2) is employed, a pin grid array (PGA) structure in which pins are bonded to the pads may be employed instead of the BGA structure. Meanwhile, such external connection terminals do not have to be necessarily provided, and a land grid array (LGA) structure may be employed in which the pads are exposed to allow external connection terminals (such as solder balls or metal pins) to be connected thereto when necessary.

The sizes (thickness or the like) of the components constituting the semiconductor device 10 of the present embodiment will be appropriately described in steps of a method of manufacturing the semiconductor device 10.

Next, the method of manufacturing the semiconductor device 10 according to the present embodiment is described with reference to FIGS. 2A to 6D illustrating an example of the manufacturing steps of the method.

First, in the initial step (see FIG. 2A), the semiconductor elements (chips) 20A to be buried in packages (wiring boards 30) are prepared, and the chips 20A are mounted on a support member 51. In this event, an adhesive layer 52 is previously formed on the chip mounting surface side of the support member 51, and the chips 20A are then mounted on the support member 51 with the adhesive layer 52 interposed therebetween.

Specifically, the adhesive layer 52 serves a role for holding (temporarily fixing) the mounted chips 20A at prescribed positions in cooperation with the support member 51. In addition, the adhesive layer 52 serves a role for preventing resin from leaking to the back surface side of the chip 20A when the chip 20A is sealed by the resin in a later step.

The thickness of the adhesive layer 52 is selected from a range approximately between several tens to hundred of µm, and a detachable adhesive that can be peeled off by heat or ultraviolet (UV) light is used as a material of the adhesive layer 52.

In addition, although the material of the support member 51 is not limited in particular, the surface of the support member 51 where the chips 20A are mounted (the surface side where the adhesive layer 52 is formed) is preferably flat. For example, a board having a relatively high flatness (thickness is approximately several hundreds of μm) such as a copper plate or a printed circuit board can be used.

The chip 20A to be mounted on the support member 51 (adhesive layer 52) having a thickness large enough to meet a requirement of the current technology (not less than 100 μm) due to the limitation on handling such as pick-up is prepared. The chip 20A described here can be fabricated, for example, by the following manner.

First, multiple devices (active elements such as CPUs) are fabricated in an array format by a required device process on one surface of a silicon wafer with a required size (diameter is 12 inches, and thickness is 750 μm, for example). Then, a passivation film formed of silicon nitride (SiN), phosphorus silicon glass (PSG), or the like is formed on the surface side of the silicon wafer where the devices are formed. Then, after the portions of the passivation film corresponding to the portions (electrode pads) of aluminum wiring layer formed in a required pattern on each of the devices are removed by laser or the like, post-shaped electrode terminals 21 are formed on the electrode pads by copper (Cu) sputtering, plating, or the like. Next, the silicon wafer is ground and thinned down to a predetermined thickness (approximately 100 μm to 200 μm, for example). Thereafter, the silicon wafer is diced into individual device units (size of 10 mm×10 mm, for example) by a dicer or the like. Thus, the chips (dies) 20A including the electrode terminals 21 formed on one surface thereof (circuit formation surface 20a) can be obtained.

During the processing to dice the silicon wafer into the individual device units, the wafer is placed on a dicing tape with a die attach film interposed therebetween, while the surface of the wafer opposite to the surface thereof where the devices are fabricated is adhered to the film. Here, a dicing frame is used to support the dicing tape. Then, the wafer is cut by the blade of the dicer along the line defining the areas of the devices and is thus divided into the individual devices (chips). Then, a diced chip 20A is picked up and mounted at a predetermined position on the support member 51 (adhesive layer 52) while the surface (circuit formation surface) 20a where the electrode terminals 21 are formed is directed upward (face-up form).

As one way to mount the chip 20A at the predetermined position, a positioning mark is previously provided at the predetermined position of the support member 51, and a microscope or the like is used to read the positioning mark through the adhesive layer 52. Then, the chip 20A is mounted at the predetermined position in accordance with the detected position.

In addition, when more highly precise alignment is required, a material having a low coefficient of thermal expansion such as a glass substrate is preferably used as the material of the support member 51.

In the next step (see FIG. 2B), the insulating layer 31 is formed on the support member 51 (adhesive layer 52) having the chips 20A mounted thereon, in such a manner as to seal the chips 20A (including the portions of the electrode terminals 21). For example, a thermosetting epoxy-based resin film is stacked on the support member 51 (adhesive layer 52), and the resin film is cured by a heating process at a temperature of 130 to 150° C. while the resin film is pressed. Thus, the resin layer (insulating layer 31) can be formed.

In this event, the adhesive layer 52 formed on the support member 51 serves a role for preventing the melted resin from leaking to the back surface side of the chips 20A. Thus, the insulating layer 31 can cover only the circuit formation surface 20a and the side surface 20c of each of the chips 20A.

Although depending on the thickness of the chips 20A to be sealed by the insulating layer 31, the thickness of the insulating layer 31 to be formed is selected in such a way that the thickness of at least the portion of the insulating layer 31 covering the electrode terminals 21 of the chips 20A is not greater than 50 μm (approximately 20 μm, for example). In addition, the material of the insulating layer 31 is not limited to a thermosetting resin, and another form of resin can be used as well. For example, a photosensitive resin may be used, or a liquid or paste resin may be used as well.

In the next step (see FIG. 2C), via holes VH1 extending to the electrode terminals 21 are formed at required positions of the insulating layer 31 (positions corresponding to the portions of the electrode terminals 21 of each of the sealed chips 20A), respectively, by a hole making process using a carbon dioxide gas laser, an excimer laser, or the like. Here, the diameter of the opening of each of the via holes VH1 can be as small as approximately 5 μm to 10 μm because the thickness of the portion of the insulating layer 31 in which the via holes VH1 are formed is not greater than 50 μm.

During this step, the via holes VH1 are formed by laser, but required via holes may be formed by photolithography in a case where the insulating layer 31 is formed of a photosensitive resin.

Figure 2A:
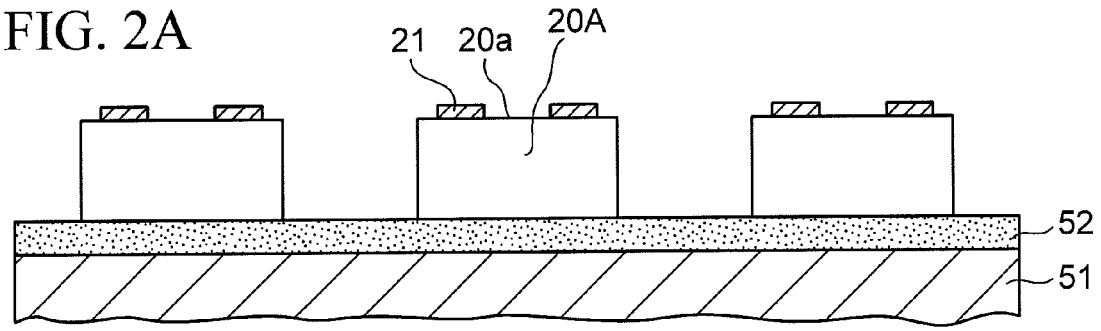
FIGS. 2A to 2D are cross-sectional views illustrating an example of steps of manufacturing the semiconductor device of FIG. 1.

In this case, a photosensitive epoxy resin is applied onto the support member 51 including the chips 20A mounted thereon (applied onto thermally detachable adhesive layer 52, in this case), and after a pre-bake treatment for the resin is performed, exposure and development (patterning of the resin layer) is performed using a mask. Then, a post-bake treatment is performed, and the resin layer (insulating layer 31) having the openings (via holes VH1) at required positions is formed as illustrated in FIG. 2C. In this event, the resin layer is patterned in accordance with the shape of the electrode terminals 21 of the chips 20A. Accordingly, when the exposure and development are performed, the portions of the insulating layer 31 corresponding to the electrode terminals 21 are removed. Thus, the via holes VH1 extending to the respective electrode terminals 21 are formed.

In the next step (see FIG. 2D), while the via holes VH1 are filled in the wiring layer 32 (vias 32a), the wiring layer 32 which is to be connected to the electrode terminals 21 of the chips 20A is formed in a required pattern shape by the semi-additive method or additive method on the insulating layer 31 including the via holes VH1 formed therein (see FIG. 2C). A specific example is described below.

First, a seed layer is formed on the insulating layer 31 (including the inner wall surfaces of the via holes VH1) by sputtering, electroless plating, or the like. For example, chrome (Cr) or titanium (Ti) is deposited (Cr layer or Ti layer is formed) by sputtering, and then copper (Cu) is further deposited thereon by sputtering to form a seed layer having a two-layer structure. Next, plating resist is formed on this seed layer by use of a patterning material and then is patterned into a required shape to form a resist layer. The resist layer is patterned in accordance with the shape of the wiring layer to be formed (for example, the wiring width is approximately 5 μm to 10 μm).

As a patterning material, a photosensitive dry film (of a structure in which the resist material is held between a polyester cover sheet and a polyethylene separator sheet) or a liquid photoresist (liquid resist such as novolac-based resin, epoxy-based resin, or the like) can be used. For example, in a case where a dry film is used, after the surface of the seed layer (Cu layer) is cleansed, the dry film is stacked thereon by thermal-pressure bonding. Then, the dry film is cured by exposure to UV radiation by using a mask patterned in a required shape. Then, the cured portion is etched away by use of a predetermined developer to form a required resist layer. Even in a case where a liquid photoresist is used, a plating resist (resist layer) can be formed through the similar steps.

Next, the wiring layer 32 (including the vias 32a) having a thickness of approximately 5 µm to 10 µm is formed on the seed layer by electrolytic Cu plating using the seed layer as a power feeding layer, the seed layer exposed through the opening portions of the resist layer. Thereafter, the resist layer is removed. For example, when a dry film is used as the plating resist, an alkaline chemical solution such as sodium hydroxide or monoethanolamine-based solvent can be used for removal. In a case where a liquid resist is used, acetone, alcohol, or the like can be used for removal.

Further, the exposed seed layer is removed by wet etching. In this case, the Cu layer being the upper layer portion of the seed layer is removed first by an etchant that dissolves Cu. Then, an etchant that dissolves Cr or Ti is used to remove the Cr layer or the Ti layer being the lower layer portion of the seed layer. Thus, the portions of the insulating layer 31 between the wiring patterns (wiring layer 32) are exposed as illustrated in FIG. 2D. Thereafter, predetermined surface cleansing or the like is performed.

Note that, the upper layer portion of the wiring layer (Cu) 32 is also removed simultaneously when the Cu layer of the seed layer is removed. However, since the wiring layer 32 thicker than the seed layer, a problem such as disconnection in the wiring layer 32 does not occur.

Figure 2B:
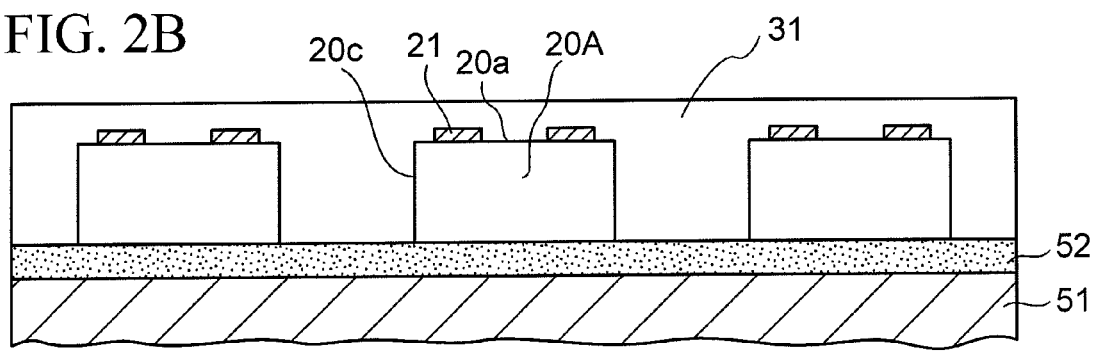
Figure 2C:
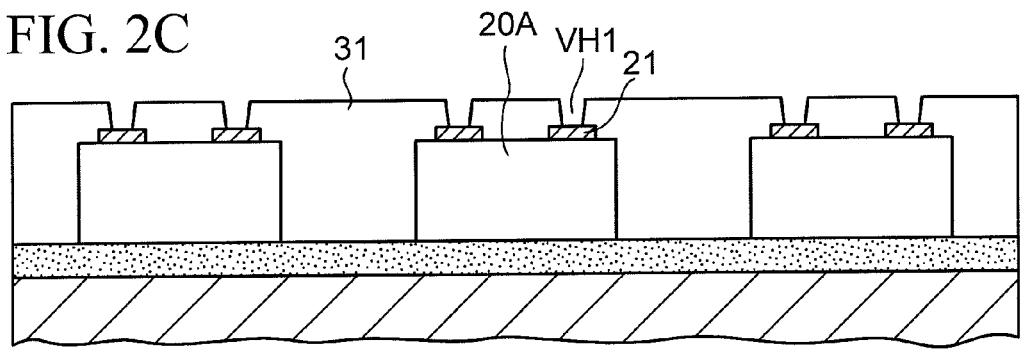
Figure 2D:
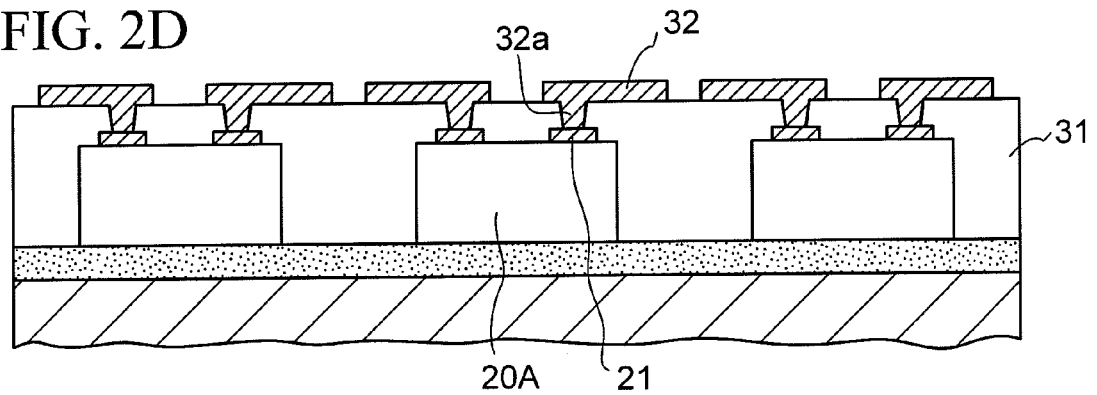

In the next step (see FIG. 3A), the insulating layer 33 is formed with a thickness of approximately 15 µm to 25 µm on the exposed insulating layer 31 and wiring layer 32 in the same manner as the processing performed in the step illustrated in FIG. 2B.

In the next step (see FIG. 3B), the support member 51 (see FIG. 3A) used as the base member to hold the chips 20A is separated and removed together with the adhesive layer 52 from the structure in which the insulating layer 33 is formed. For example, the support member 51 is removed by thermally separating the adhesive layer 52.

Thus, the structure including the following configuration is completed. Firstly, the insulating layer 31 covers the circuit formation surface 20a and the side surface 20c of each of the chips 20A as illustrated in FIG. 3B. In addition, the wiring layer formed on the one surface 31a of the insulating layer 31 is connected to the electrode terminals 21 of each of the chips 20A while being covered by the insulating layer 33. Moreover, the back surface of each of the chips 20A opposite to the surface thereof where the electrode terminals 21 are formed is exposed from and flush with the other surface of the insulating layer 31.

In the next step (see FIG. 3C), the structure is flipped upside down (in such a manner that the back surface of the chip 20A is directed upward while the surface side thereof where the insulating layer 33 is formed is directed downward) and then mounted on a support member 53. At this time, an adhesive layer 54 is formed previously on the mounting surface side of the support member 53, and thus the support member 53 holds the structure with the adhesive layer 54 interposed therebetween. The same materials and thicknesses of the support member 51 and the adhesive layer 52 used in the step illustrated in FIG. 2A are used for the materials and thicknesses of the support member 53 and the adhesive layer 54.

In the next step (see FIG. 3D), a chemical mechanical polishing (CMP) method, a blasting method or the like is used to polish the back surface of the chip 20A and the front surface of the insulating layer 31 and to reduce the thickness of each of the chips 20A to be approximately 10 µm to 50 µm. Thus, the back surface 20b of the chip 20A sealed by the insulating layer 31 and the other surface 31b of the insulating layer 31 are exposed on the same surface level.

Figure 3A:
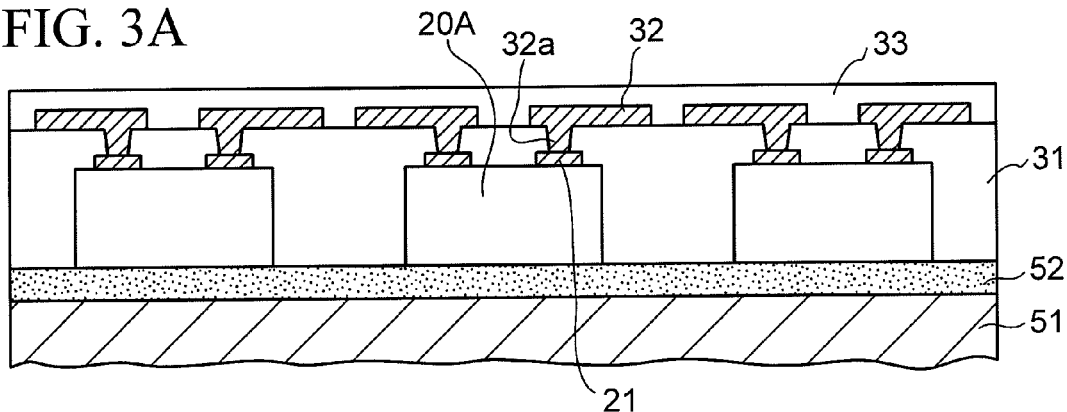
FIGS. 3A to 3D are cross-sectional views illustrating manufacturing steps subsequent to the steps of FIGS. 2A to 2D.
Figure 3B:
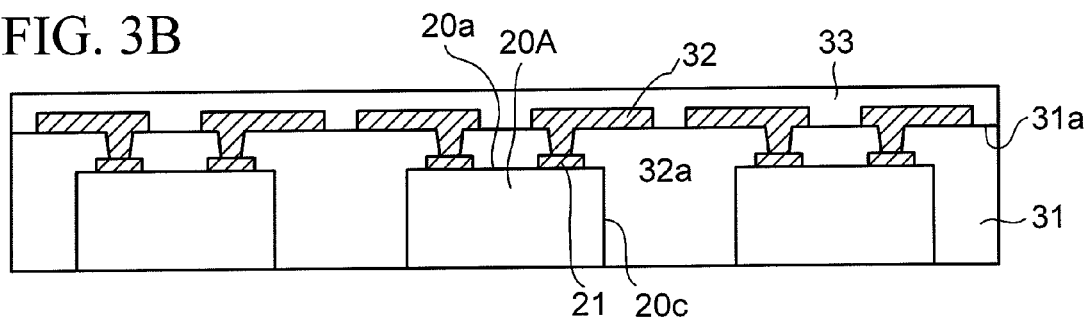
Figure 3C:
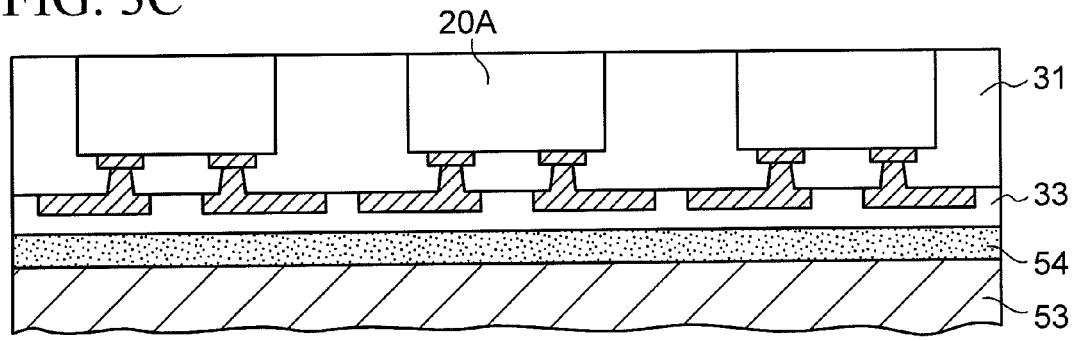

In the next step (see FIG. 4A), the insulating layer 35 is formed with a thickness of approximately 10 µm on the exposed back surface 20b of the chip 20 and another surface 31b of the insulating layer 31, in the same manner as the processing performed in the step illustrated in FIG. 3A.

In the next step (see FIG. 4B), in the same manner as the processing performed in the step illustrated in FIG. 2C, via holes VH3 are formed at required positions of the insulating layer 35 (positions corresponding to the positions of pads each defined at a portion of the wiring layer 32 connected to a corresponding one of the electrode terminals 21 of the corresponding chip 20 in the region outside the mounting area of the chip 20) by a hole making process using a carbon dioxide gas laser or the like. Here, the via holes VH3 respectively extend to the portions of the pads while penetrating through the insulating layer 35 and the underlying insulating layer 31.

The via holes VH3 formed in this step have the opening diameter relatively larger than the via holes VH1 formed in the step illustrated in FIG. 2C, in order that the via holes VH3 penetrate through the insulating layer 35 covering the back surfaces 20b of the chips 20 and the relatively thick insulating layer 31 sealing the chips 20. Although being dependent on the depth of the via holes VH3 (thicknesses of the insulating layers 35 and 31), the opening diameter of the via holes VH3 is set approximately 100 µm to 200 µm when the depth of the via holes VH3 is selected to be approximately 100 µm to 200 µm, for example.

In the next step (see FIG. 4C), in the same manner as the processing performed in the step illustrated in FIG. 2D, the wiring layer 36 connected to the wiring layer 32 (portions of the pads) of the inner layer side is formed in a required pattern shape by the semi-additive method or the like on the insulating layers 35 and 31 having the via holes VH3 formed therein (FIG. 4B), while the via holes VH3 are filled in the wiring layer 36 (vias 36a). Specifically, the wiring layer 36 on the side of the back surface 20b of the chip 20 is connected to the wiring layer 32 on the side of the electrode terminals 21 of the chip 20 through the vias 36a.

In the next step (see FIG. 4D), the insulating layer 37 is formed with a thickness of approximately 15 µm to 25 µm on the exposed insulating layer 35 and the exposed wiring layer 36, in the same manner as the processing performed in the step illustrated in FIG. 3A.

In the next step (see FIG. 5A), in the same manner as the processing performed in the step illustrated in FIG. 2C, via holes VH4 are formed at required positions of the insulating layer 37 (positions corresponding to the positions of pads each defined at a portion of the wiring layer 36) by a hole making process using a carbon dioxide gas laser or the like. Here, the via holes VH4 respectively extend to the portions of the pads. The thickness of the portion of the insulating layer 37 where the via holes VH4 are formed is relatively small. Thus, as in the case of the via holes VH1 formed in the step illustrated in FIG. 2C, the opening diameter of the via holes VH4 can be as small as approximately 5 µm to 10 µm.

In the next step (see FIG. 5B), in the same manner as the processing performed in the step illustrated in FIG. 2D, the wiring layer 38 connected to the underlying wiring layer 36

(portions of the pads) is formed in a required pattern shape by the semi-additive method or the like on the insulating layer 37 having the via holes VH4 formed therein (FIG. 5A), while the via holes VH4 are filled in the wiring layer 38 (vias 38a). The wiring layer 38 includes the portions of the pads P2 defined at the required positions thereof and constitutes an outermost wiring layer of the wiring board 30.

However, the same processing as the processing performed in the steps illustrated in FIGS. 4D to 5B may be repeated as needed to stack build-up layers (insulating layers and wiring layers) one on top of another until a required number of layers are obtained.

In the next step (see FIG. 5C), the solder resist layer 40 with a thickness of approximately 20 μm to 30 μm is formed on the surface side of the structure where the wiring layer 38 (pads P2) is formed, in such a manner as to cover the surface side of the structure (cover the wiring layer 38 and the insulating layer 37) while leaving the portions of the pads P2 exposed from the surface. The solder resist layer 40 is made of a photosensitive epoxy acrylic-based resin, for example. In addition, the solder resist layer 40 can be formed by application of the resin resist (or lamination of the resin resist formed into a film shape) and patterning of the resist in a required shape. With this patterning, opening portions (each having a diameter of approximately 250 μm) are formed in the solder resist layer 40. Thus, the pads P2 of the wiring layer 38 are exposed through the respective opening portions.

In the next step (see FIG. 5D), in the same manner as the processing performed in the step illustrated in FIG. 3B, the adhesive layer 54 (FIG. 5C) is separated by heat or the like from the structure having the solder resist layer 40 formed therein and is thus removed from the structure.

Figure 5A:
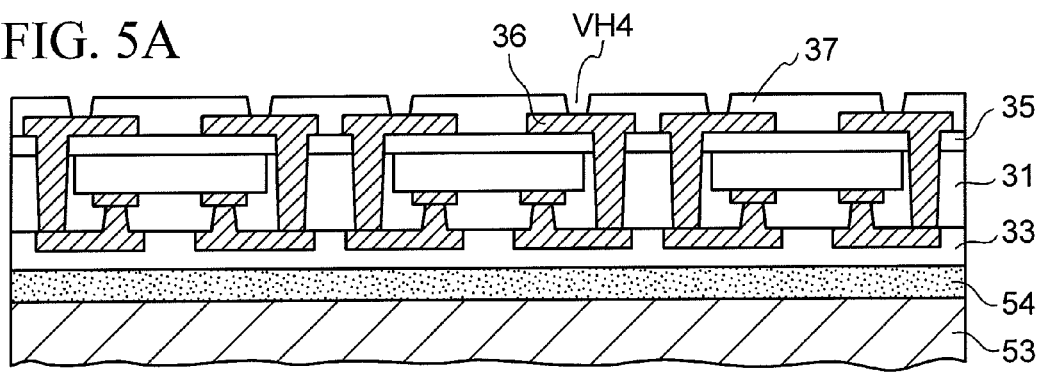
FIGS. 5A to 5D are cross-sectional views illustrating manufacturing steps subsequent to the steps of FIGS. 4A to 4D.
Figure 5B:
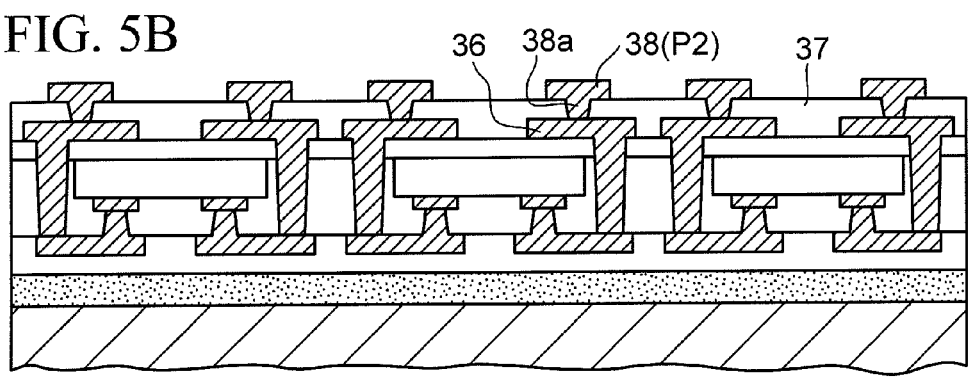
Figure 5C:
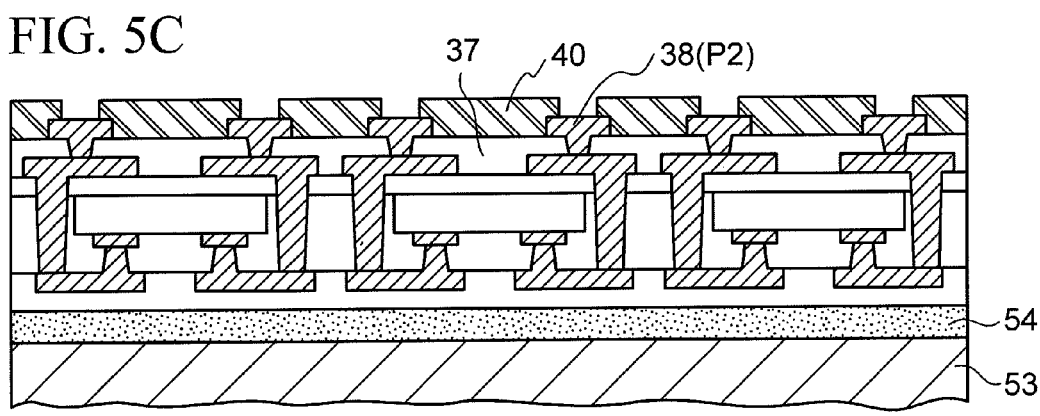
Figure 5D:
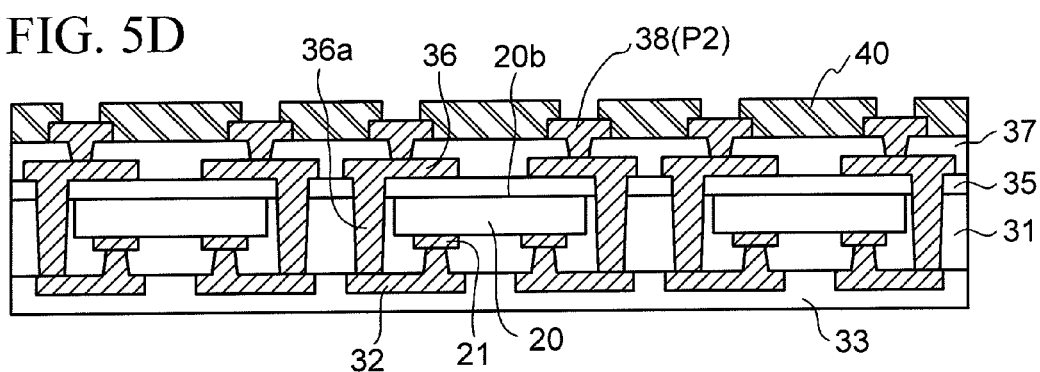
Figure 6A:
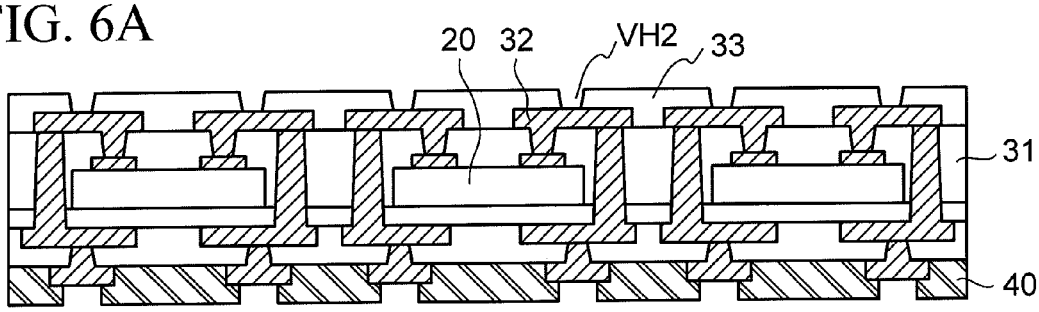
FIGS. 6A to 6D are cross-sectional views illustrating manufacturing steps subsequent to the steps of FIGS. 5A to 5D.
Figure 6B:
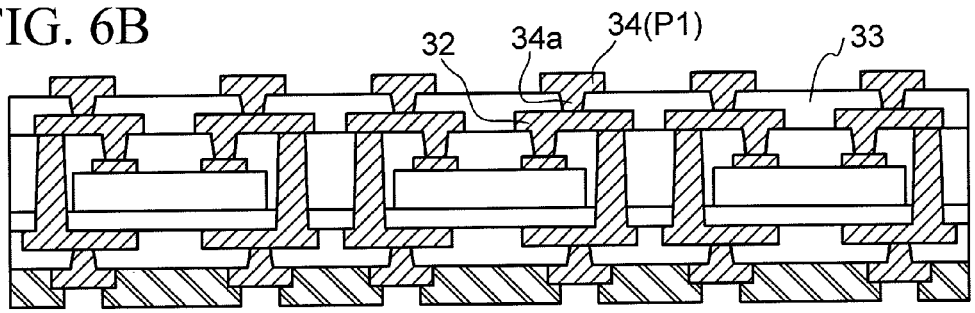
Figure 6C:
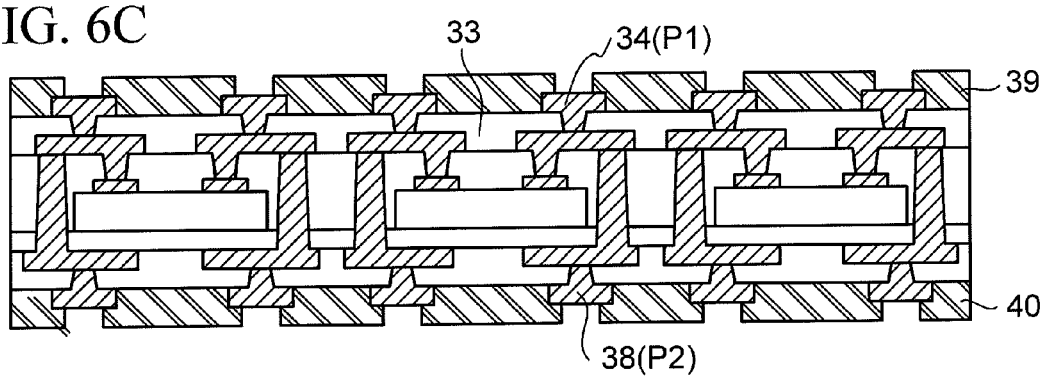
Figure 6D:
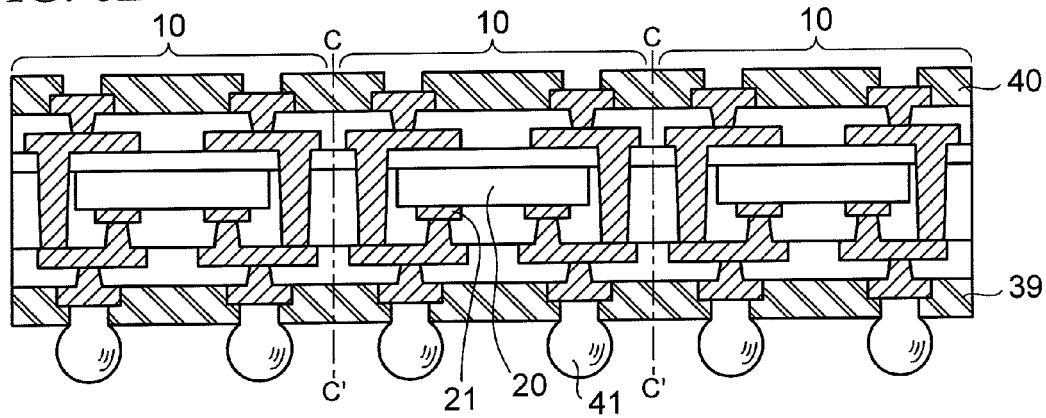

Accordingly, the structure including the following configuration as illustrated in FIG. 5D is completed. In the structure, the chips 20 are buried in the insulating layer 31. In addition, the insulating layer 33 formed while covering the wiring layer 32 on the side of the electrode terminals 21 of the chip 20 is exposed. Then, the solder resist layer 40 formed while covering the wiring layer 36 and the wiring layer 38 (except for the portions of the pads P2) connected to the wiring layer 36 is exposed. Here, the wiring layer 36 is formed on the side of the back surface 20b of the chip 20.

Note that, since warp may occur in the structure at this point of time, a component equivalent to the aforementioned support member 51 (adhesive layer 52) is adhered to the surface side of the structure where the solder resist layer 40 is formed, if such warp may cause a problem in the steps of forming build-up layers to be performed thereafter.

In the next step (see FIG. 6A), the structure is flipped upside down. Then, in the same manner as the processing performed in the step illustrated in FIG. 5A, the via holes VH2 are formed at required positions of the insulating layer 33 (positions corresponding to the portions of pads each defined at a portion of the wiring layer 32) by a hole making process using a carbon dioxide gas laser, the via holes VH2 extending to the portions of the pads. The thickness of the portion of the insulating layer 33 where the via holes VH2 are formed is relatively small. Thus, as in the case of the via holes VH4 formed in the step illustrated in FIG. 5A, the opening diameter of the via holes VH2 can be as small as approximately 5 μm to 10 μm.

In the next step (see FIG. 6B), in the same manner as the processing performed in the step illustrated in FIG. 5B, the wiring layer 34 connected to the underlying wiring layer 32 (portions of the pads) is formed in a required pattern shape by the semi-additive method or the like on the insulating layer 33 having the via holes VH2 formed therein (FIG. 6A), while the via holes VH2 are filled in the wiring layer 34 (vias 34a). The wiring layer 34 includes the portions of the pads P1 defined at the required positions thereof and constitutes an outermost wiring layer of the wiring board 30 in this embodiment.

In this case as well, as needed, build-up layers (insulating layers and wiring layers) may be further stacked one on top of another appropriately until a required number of layers are obtained.

In the next step (see FIG. 6C), in the same manner as the processing performed in the step illustrated in FIG. 5C, the solder resist layer 39 with a thickness of approximately 20 μm to 30 μm is formed on the surface side of the structure where the wiring layer 34 (pads P1) is formed, in such a manner as to cover the surface side of the structure (cover the wiring layer 34 and the insulating layer 33) while leaving the portions of the pads P1 exposed from the surface.

Further, an appropriate surface treatment (Ni/Au plating or the like) is applied onto the pads P1 and P2 exposed through the opening portions of the solder resist layers 39 and 40 which are respectively formed on the both surfaces of the structure.

In the final step (see FIG. 6D), after application of appropriate flux on the pads P1 (FIG. 6C) exposed from the solder resist layer 39 on the one surface (surface side where the electrode terminals 21 of the chip 20 are formed) of the structure, solder balls 41 used as the external connection terminals are placed on the pads P1 and bonded thereto by reflow soldering at a temperature approximately between 240 and 260° C. Further, the surfaces are cleansed to remove the flux. Subsequently, the structure is cut by a dicer or the like along lines defining the areas of the devices (lines illustrated by dashed lines in C-C' of FIG. 6D) to divide the structure into individual device units (semiconductor devices 10).

In this step, dicing is performed after the solder balls 41 are bonded to the pads P1. However, the processing order can be reversed. In this case, the dicing is performed first, and then, the solder balls 41 are bonded to each of the devices. In addition, although the solder balls 41 are bonded to the pads P1 (BGA form) in this step, the external connection terminals are not limited in the BGA form. Instead, pins may be used for bonding (PGA form). Alternatively, such external connection terminals may not be bonded to the pads P1, and the pads P1 may be left exposed so as to allow the external connection terminals to be bonded thereto later when necessary (LGA form).

Through the aforementioned steps, the semiconductor device 10 (FIG. 1) of the present embodiment is fabricated. In this configuration of the semiconductor device 10, the total thickness of the semiconductor device 10 can be not greater than 300 μm in a state where the two wiring layers 32 and 34 are stacked on the side of the electrode terminals 21 of the chip 20 buried in the wiring board 30 and the two wiring layers 36, and 38 are stacked on the side of the back surface 20b of the chip 20.

As described above, according to the semiconductor device 10 according to the present embodiment and the method of manufacturing the same, the build-up layers (insulating layers 33, 35, and 37 and the wiring layers 32, 34, 36, and 38) are stacked on the side of the electrode terminals 21 and on the side of the back surface 20b of the chip 20 while the relatively thick insulating layer 31 used to embed and seal the semiconductor element (chip) 20 is used as the support base member. The wiring layers 32 and 34 stacked on the side of the electrode terminals 21 of the chip 20 are electrically connected to each other through the vias 34a formed in the insulating layer 33. Likewise, the wiring layers 36, and 38 stacked on the side of the back surface 20b of the chip 20 are electrically connected to each other through the vias 38a formed in the insulating layer 37. Moreover, the wiring layer 32, connected to the electrode terminals 21 of the chip 20 through the vias 32a, and the wiring layer 36 formed on the side of the back surface 20b of the chip 20 (formed on the insulating layer 35) are electrically connected to each other through the vias 36a formed while penetrating through the insulating layers 35 and 31.

Specifically, the semiconductor chip 20 and the wiring board (package) 30 are connected to each other not through the solder bumps 62 (bump diameter is not less than 50 μm with the current technology, which is relatively large) observed in the related art illustrated in FIG. 7, but directly through the vias 32a within the package 30. Accordingly, a reduction in thickness of the entire semiconductor device 10 (chip buried package) can be achieved. In addition, since the via diameter is smaller (approximately 5 μm to 10 μm) than the bump diameter using the current technology, a reduction in the pitch between the electrode terminals 21 of the semiconductor chip 20 can be achieved.

Moreover, the build-up layers (insulating layers 33, 35, and 37 and the wiring layers 32, 34, 36, and 38) are stacked on both surface sides (on the side of electrode terminals 21 and on the side of the back surface 20b of the chip 20) of the structure while the portion of the insulating layer 31 sealing the chip 20 is used as the core. Thus, when the structure is viewed vertically, the distribution of the coefficient of thermal expansion (CTE) is almost symmetric in the up-and-down direction. Thus, even when heat generated due to reflow soldering performed for the terminal connection is applied in a case such as where the device (chip buried package) 10 is mounted on a motherboard or the like, or where a POP structure is formed with another package, it is possible to suppress the occurrence of warp in the board 30 (to reduce warp of the board).

Moreover, the wiring layers 36 and 38 (pads P2 for external connection) are formed on the side of the back surface 20b of the semiconductor chip 20. Thus, even in a case where the device 10 is applied to a POP structure or an MCP structure, the degree of freedom in mounting another package or an SMT component can be increased without causing the inconvenience observed in the related art. Specifically, the device 10 can be easily applied to a POP structure or the like.

For example, a POP structure having two levels can be easily mounted in the following manner. An appropriate amount of solder is applied onto the pads P2 exposed from the surface side of the structure opposite to the surface side where the solder balls 41 are bonded. Then, external connection terminals (solder balls) of another package are brought into contact with the applied solder. Then, the both packages are bonded to each other by melting the solder by reflow soldering. Furthermore, a POP structure having three or more levels can be mounted as needed. Such a POP structure contributes to a further increase in the performance (functionality) as a semiconductor device.

In addition, when a POP structure is formed by use of the device (chip buried package) 10, the POP structure can achieve a further reduction in thickness than a POP structure using the current technology does (structure in which semiconductor element mounting boards requiring flip-chip bonding are stacked one on another). Moreover, an electronic component to be mounted on the semiconductor device (chip buried package) 10 of the present embodiment is not limited to the one used in the aforementioned POP structure, and various types of electronic components (an active element such as another semiconductor element and a passive element such as a chip capacitor, a resistor, or the like) can be mounted on the semiconductor device (chip buried package) 10. Thus, the semiconductor device (chip buried package) 10 is extremely advantageous in building an MCP structure.

Moreover, the back surface of the chip 20A is polished (see FIG. 3D) after the semiconductor element (chip 20A) is sealed by the insulating layer 31. Thus, a reduction in thickness of the chip 20 to be eventually buried in the package 30 can be achieved, which in turn, contributes to a reduction in thickness of the semiconductor device 10. Moreover, the thickness of the chip 20A does not have to be reduced until the chips 20A resulting from dicing on the dicing tape are picked up and are mounted on the support member 51. This is advantageous in facilitating handling of the chips 20A.

Figure 3D:
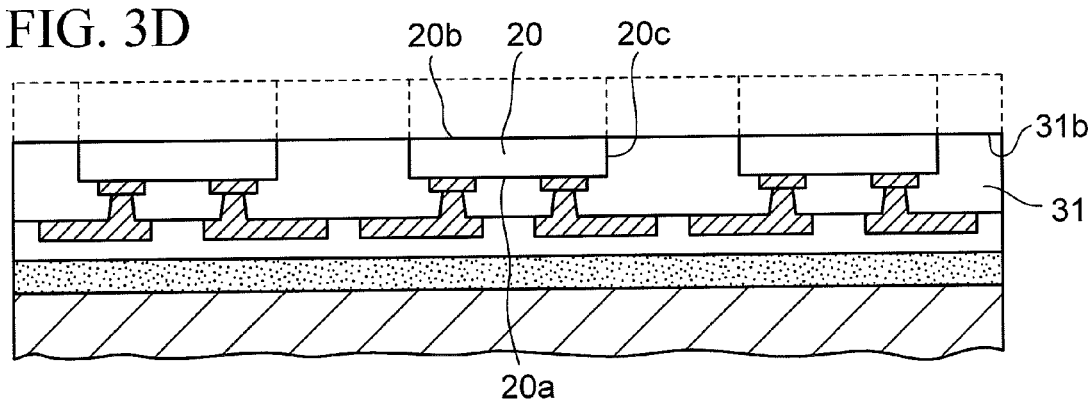
Figure 4A:
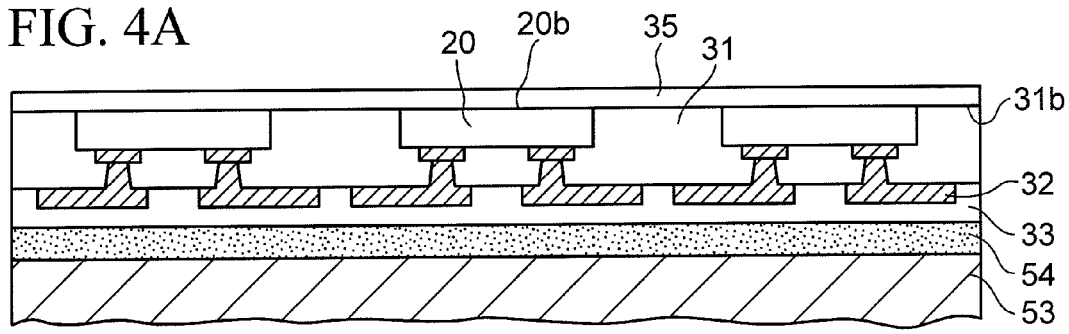
FIGS. 4A to 4D are cross-sectional views illustrating manufacturing steps subsequent to the steps of FIGS. 3A to 3D.
Figure 4B:
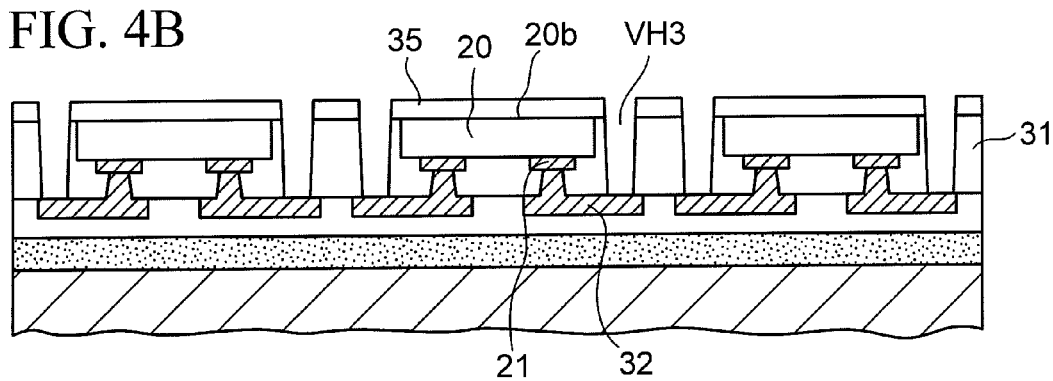
Figure 4C:
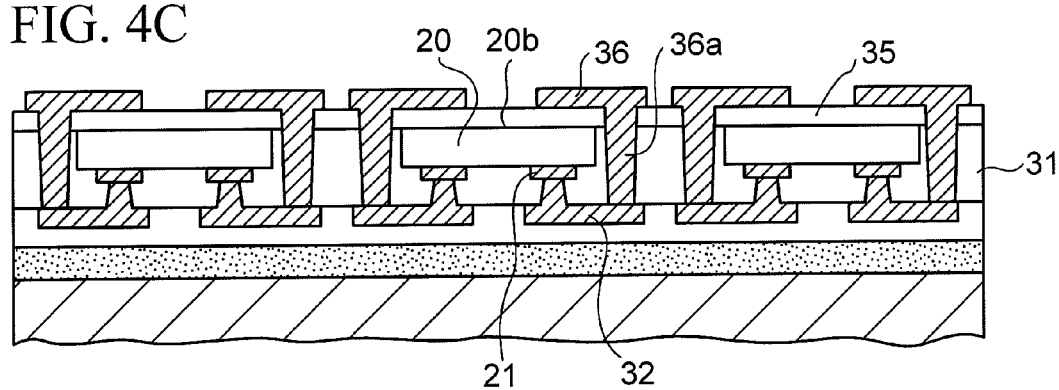
Figure 4D:
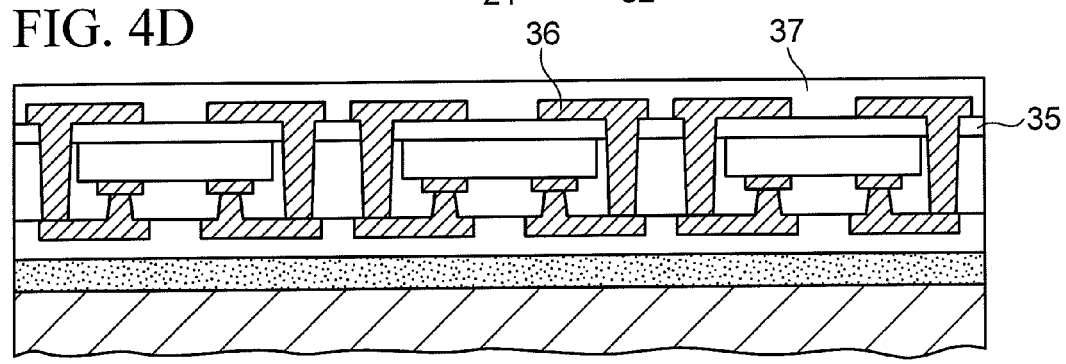

In addition, the thickness of the insulating layer 31 sealing the chip 20 (20A) is reduced along with the polishing of the back surface of the chip 20A (see FIG. 3D). Thus, the diameter of each of the vias 36a (see FIG. 4C) connecting the wiring layer 32 on the side of the electrode terminals 21 of the chip 20 and the wiring layer 36 on the side of the back surface 20b can be relatively small. Such a reduction in the size of the diameter can contribute to a reduction in the size of the semiconductor device 10.

In the aforementioned embodiment, an example of the case where a single semiconductor element 20 is buried in the package (wiring board 30) constituting the semiconductor device 10 is described. However, the number of semiconductor elements buried in the package is not limited to one as a matter of course. Thus, a package structure in which two or more semiconductor elements are buried in the package may be appropriately employed in accordance with functions or the like required as a semiconductor device.

Furthermore, in the aforementioned embodiment, an example of the case where an active element (chip 20) such as a CPU is buried in the package 30 is described. However, the element to be buried in the board is not limited to the active element as a matter of course. The present invention can be applied in the same manner to a case where a passive element such as a chip capacitor, a resistor, or an inductor is buried in the board.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alternations, could be made hereto without departing from the spirit and scope of the invention.

What is claimed is:

1. A semiconductor element mounting structure comprising:
   a semiconductor element having a first surface including an electrode terminal formed thereon, and a second surface located opposite to the first surface;
   a first insulating layer in which the semiconductor element is embedded, wherein the second surface of the semiconductor element and a surface of the second surface side of the first insulating layer constitute the same surface;
   a second insulating layer contacting the second surface of the semiconductor element and the surface of the second surface side of the first insulating layer, and formed on them, wherein no wiring layer intervenes between the second surface of the semiconductor element and the second insulating layer;

a first via formed in the first insulating layer, and connected to the electrode terminal;

a first wiring layer formed on a surface of the first surface side of the first insulating layer, and connected to the electrode terminal through the first via;

a second via formed in the first insulating layer and second insulating layer located outside the semiconductor element, and connected to the first wiring layer; and a second wiring layer formed on a surface of the second surface side of the second insulating layer, and connected to the first wiring layer through the second via, wherein the second wiring layer extends to a region corresponding to the semiconductor element from the second via.

2. The semiconductor element mounting structure according to claim 1, wherein the first wiring layer and the first via are integrally formed, and the second wiring layer and the second via are integrally formed, and an edge part of the second via is connected to a surface of the first wiring layer, the surface which contacts the first insulating layer.

3. The semiconductor element mounting structure according to claim 2, wherein other insulating layer and other wiring layer are laminated on the first wiring layer and the second wiring layer, respectively.

4. The semiconductor element mounting structure according to claim 1, wherein the respective insulating layers are formed of resin, and wherein the respective wiring layers are formed of a plating layer.

5. The semiconductor element mounting structure according to claim 3, further comprising solder resist layers covering outermost wiring layers on the first surface side and the second surface side, respectively, wherein each of the solder resist layers is formed to expose a pad portion therefrom, the pad portion being defined in the corresponding outermost wiring layer.

6. The semiconductor element mounting structure according to claim 5, wherein the first insulating layer is formed to be thicker than each of the second insulating layers.

* * * * *